United States Patent
Zha et al.

(10) Patent No.: US 12,348,311 B2
(45) Date of Patent: Jul. 1, 2025

(54) METHOD FOR 5G NR LOW-DENSITY PARITY-CHECK DECODING

(71) Applicant: PCTEL, Inc., Bloomingdale, IL (US)

(72) Inventors: Wei Zha, Boyds, MD (US); Kamran Ghavami, Clarksburg, MD (US); Amir Soltanian, Potomac, MD (US)

(73) Assignee: PCTEL, INC., Bloomingdale, IL (US)

( * ) Notice: Subject to any disclaimer, the term of this patent is extended or adjusted under 35 U.S.C. 154(b) by 24 days.

(21) Appl. No.: 18/444,873

(22) Filed: Feb. 19, 2024

(65) Prior Publication Data

US 2024/0430034 A1    Dec. 26, 2024

Related U.S. Application Data (60) Provisional application No. 63/522,753, filed on Jun. 23, 2023.

(51) Int. Cl.
*H04L 1/00* (2006.01)
*H04L 27/26* (2006.01)

(52) U.S. Cl.
CPC .......... *H04L 1/0057* (2013.01); *H04L 1/0054* (2013.01); *H04L 27/2651* (2021.01)

(58) Field of Classification Search
CPC ... H04L 1/0054; H04L 1/0057; H04L 1/0061; H04L 27/2651; H03M 13/6325; H03M 13/6337
See application file for complete search history.

(56) References Cited

U.S. PATENT DOCUMENTS

| | | | |
|---|---|---|---|
| 8,286,048 B1 | 10/2012 | Chen et al. | |
| 2011/0096858 A1 | 4/2011 | Kilmer | |
| 2013/0121392 A1* | 5/2013 | Thompson | H04L 27/2647 375/232 |
| 2015/0110207 A1* | 4/2015 | Murrin | H04L 5/0048 375/346 |
| 2017/0141936 A1* | 5/2017 | Lee | H04L 5/0048 |
| 2020/0336339 A1 | 10/2020 | Nissila | |

OTHER PUBLICATIONS

Marchand, C. et al., "Architecture and Finite Precision Optimization for Layered LDPC Decoders," Journal of Signal Processing Systems, vol. 65, (2011), pp. 185-197.

(Continued)

*Primary Examiner* — Shelly A Chase
(74) *Attorney, Agent, or Firm* — Husch Blackwell LLP (57) ABSTRACT

A system and method for 5G new radio (NR) low-density low density parity check (LDPC) decoding comprising performing a Fast Fourier Transform using a Fast Fourier Transform algorithm. The system and method determines if a reference sequence is present and performing a channel estimate and a channel interpolate for the channel estimate if the reference sequence is present. The system and method demodulates at least one orthogonal frequency division multiplexing (OFDM) symbol according to $r_{bin}*\text{conj}(H_{bin})/(\text{norm}(H_{bin})^2+\text{Noise\_Power})$. The system and method decodes the demodulated at least one orthogonal frequency division multiplexing symbol, and determines if the decoded at least one orthogonal frequency division multiplexing symbol is correct.

13 Claims, 5 Drawing Sheets

(56) References Cited

OTHER PUBLICATIONS

Boutillon, E. et al., "Hardware Design and Realization for Iteratively Decodable Codes," Chapter 13, Academic Press Library in Mobile and Wireless Communications, Channel Coding: Theory, Algorithms, and Applications, 2014, pp. 583-651. (Excerpt 2.1—Quantizationof Input LLR).
Extended European Search Report re Application No. EP 24169324.1, dated Sep. 24, 2024.
Yoon, E. et al, "LDPC Decoding With Low Complexity for OFDM Index Modulation," IEEE Access, vol. 9, (May 4, 2021) pp. 68435-68444, XP011854497; doi: 10.1109/ACCESS.2021.3077256.
Alkhasraji, J. et al, "Coded OFDM over Short Range Underwater Optical Wireless Channels using LED," Oceans 2017—Aberdeen, pp. 1-7. IEEE, 2017 (Jun. 19, 2017); doi: 10.1109/OCEANSE.2017.8084784.
Sesia, S. et al, "LTE—The UMTS Long Term Evolution: From theory to practice," John Wiley & Sons, Inc., Sections 6.3 and 8.4, pp. 148, 178-180 (Aug. 29, 2011); XP093203339, ISBN: 978-0-470-66025-6.

\* cited by examiner

METHOD FOR 5G NR LOW-DENSITY PARITY-CHECK DECODING

This application claims the benefit of the filing date of U.S. Provisional Application Ser. No. 63/522,753 filed on Jun. 23, 2023, which is incorporated herein by reference.

FIELD OF THE INVENTION

This disclosure generally pertains to decoding for 5G new radio (NR) channels.

BACKGROUND OF THE INVENTION

Currently, some 5G new radio (NR) channels leave certain portions of assigned bandwidth (BW) blank, without a reference sequence (RS) for channel estimation on the combined reference sequence and orthogonal frequency division multiplexing (RS-OFDM) symbols. Moreover, on the data orthogonal frequency division multiplexing (OFDM) symbols, no signal of a physical downlink shared channel (PDSCH) is being transmitted on this portion of the bandwidth either. Thus, this portion of the bandwidth is purely noise. However, this same portion of bandwidth is included when collecting log-likelihood ratio (LLR) for low density parity check (LDPC) decoding of the physical downlink shared channel.

The existing method normalizes the demodulation output by the norm (power) of channel, to minimize the number of bits needed to represent log-likelihood ratio for efficient low density parity check decoder implementation. Such normalization is similar to a zero-forcing (ZF) equalizer, where when the channel power is low, the noise gets amplified (noise enhancement).

To prevent noise from getting amplified, the normalization needs to be done over the sum of channel power and noise power, similar to a minimum-mean square error (MMSE) equalizer. When channel power is low—or almost empty as in the case of new radio channels—the noise power may be much higher than the channel power, thus preventing noise from getting amplified. On the other hand, if the channel power is high, then adding a small noise power term will result in only slightly scale down.

The noise power may be calculated as a byproduct of orthogonal frequency division multiplexing channel estimation and signal-to-noise ratio (SNR) calculation. However, the Fast Fourier Transform or Inverse Fast Fourier Transform (FFT/IFFT) may have different gains for different implementations and platforms. Thus, the noise power estimation may need to take these differences into account, and the resulting scaling may need to be adjusted on different implementations and platforms.

BRIEF SUMMARY OF THE INVENTION

One embodiment pertains to a method for 5G new radio (NR) low-density low density parity check (LDPC) decoding that performing a Fast Fourier Transform using a Fast Fourier Transform algorithm, determining if a reference sequence is present, performing a channel estimate and a channel interpolate for the channel estimate if the reference sequence is present, demodulating at least one orthogonal frequency division multiplexing (OFDM) symbol according to $r_{bin}^* \text{conj}(H_{bin})/(\text{norm}(H_{bin})^2 + \text{Noise\_Power})$, decoding the demodulated at least one orthogonal frequency division multiplexing symbol, and determining if the decoded at least one orthogonal frequency division multiplexing symbol is correct.

In another embodiment, a method for 5G new radio (NR) low-density low density parity check (LDPC) decoding comprises performing a Fast Fourier Transform using a Fast Fourier Transform algorithm, determining if a reference sequence is present, demodulating at least one orthogonal frequency division multiplexing (OFDM) symbol according to $r_{bin}^* \text{conj}(H_{bin})/(\text{norm}(H_{bin})^2 + \text{Noise\_Power})$ if the reference sequence is not present, decoding the demodulated at least one orthogonal frequency division multiplexing symbol, and determining if the decoded at least one orthogonal frequency division multiplexing symbol is correct.

In another embodiment, the noise power is obtained by measuring a mean channel power across all bins and taking a ratio of the mean channel power as the noise power.

Further in another embodiment, the ratio of the mean channel power is $\frac{1}{10}$.

In yet another embodiment, the method is directed to noise power estimated by using a portion of the mean channel power across orthogonal frequency division multiplexing bins or subcarriers or tones, for example, $\frac{1}{10}$ of the mean channel power may be used.

In yet another embodiment, a system for 5G new radio (NR) low-density low density parity check (LDPC) decoding comprises an antenna signal, a Fast Fourier Transform calculator that receives the antenna signal and performs a Fast Fourier Transform algorithm to produce a FFT output, a reference sequence detector that checks whether a reference sequence is present in the FFT output, a channel estimator that generates a channel estimate for the FFT output when the reference sequence is detected to be present in the FFT output and a channel interpolator that processes the channel estimate and produces a channel interpolator, a demodulation calculator and a log-likelihood ratio calculator that performs a calculation on the channel interpolator output according to $r_{bin}^* \text{conj}(H_{bin})/(\text{norm}(H_{bin})^2 + \text{Noise\_Power})$ and produces a log-likelihood ratio output, a low density parity check decoder that decodes the log-likelihood ratio output, and a cyclic redundancy check that determines whether the decoded log-likelihood ratio is correct.

Before explaining the disclosed embodiments of the present disclosure in detail, it is to be understood that the invention is not limited in its application to the details of the particular arrangement shown, since the invention is capable of other embodiments. Exemplary embodiments are illustrated in referenced FIGS. of the drawings. It is intended that the embodiments and FIGS. disclosed herein are to be considered illustrative rather than limiting. Also, the terminology used herein is for the purpose of description and not of limitation.

DETAILED DESCRIPTION

While this invention is susceptible of embodiments in many different forms, there are shown in the drawings and is described in detail herein specific embodiments with the understanding that the present disclosure is an exemplification of the principles of the invention. It is not intended to limit the invention to the specific illustrated embodiments. The features of the invention disclosed herein in the description, drawings, and claims can be significant, both individually and in any desired combinations, for the operation of the invention in its various embodiments. Features from one embodiment can be used in other embodiments.

As shown in FIGS. 1-7, the embodiments of this disclosure include a system and method for 5G new radio low density parity check decoding algorithm.

Current literatures related to LLR calculation either focus on the effect of saturation and quantization noise effect on the limited number of bits LLR (such as IMPACT OF LLR SATURATION AND QUANTIZATION ON LDPC MIN-SUM DECODERS, N. Kanistras, I. Tsatsaragkos, I. Paraskevakos, A. Mahdi and V. Paliouras, 2010 IEEE Workshop on Signal Processing Systems (SiPS), 328-333), or on how to scale the LLR based on channel power spread (such as U.S. Pat. No. 8,286,048 by Chen et al.) for its specific offset δ min-sum LDPC decoding algorithm. However, such an offset δ requires a number of bits to represent.

One embodiment of this disclosure is the log-likelihood ratio calculation method which applies to all LPDC decoding algorithms, including, but not limited to, offset min-sum algorithm, normalized min-sum algorithm, the brief propagation (BP) algorithm for optimum performance and etc.. Further, the log-likelihood ratio calculation method disclosed herein is not limited to low density parity check decoding. The log-likelihood ratio calculation method may be applied to decoding of other error control coding (ECC) schemes, including, but not limited to, Turbo decoder, convolutional decoder, and Polar decoder.

In another literature, HARDWARE DESIGN AND REALIZATION FOR ITERATIVELY DECODABLE CODES, Emmanuel Boutillon, Guido Masera, Academic Press Library in Mobile and Wireless Communications, 2014, it discusses the limited number of bits for LLR, and the problem of small LLR values may be reduced to 0's, which may cause the decoding algorithm to fail. Thus, another embodiment of the present disclosure is directed to utilization of normalization by channel power plus noise power which prevents the wide spread of the log-likelihood ratio values and, as a result, is suitable for limited number of bits implementation. When signal is weak and noise is relatively high compared to the signal, the LS equalization is effectively divided by signal power causing the noise to amplify. Adding the noise power to the divisor prevents the noise amplification. Therefore, the spread of the log-likelihood ratio remains smaller.

In an embodiment of the present invention, the allocated bandwidth of the 5G new radio physical downlink shared channel is divided into a number of bundles. For example, the bandwidth may be divided into 14 bundles with a bundle size having 24 bins. A typical bundle size is 24 bins or 2 resource blocks (RBs), where 1 RB contains 12 bins or resource elements (REs). The bundle size to bandwidth part (BWP) relationship is shown in the Table 1 below.

TABLE 1

BWP to Bundle Size Relationship, measured in RBs.

| Bandwidth | RGB Size (P) | |
|---|---|---|
| Part Size | Configuration 1 | Configuration 2 |
| 1-36 | 2 | 4 |
| 37-72 | 4 | 8 |
| 73-144 | 8 | 16 |
| 145-275 | 16 | 16 |

The channel estimate for each bundle is applied to each bundle independently. Typically, there is only one single bundle and the orthogonal frequency division multiplexing channel estimate is done for all bins. Thus, in this embodiment, the channel power of different bundles has a much wider spread than the traditional orthogonal frequency division multiplexing. In this embodiment, the channel power can drop to zero or nearly zero if some noise is present. The noise is suppressed by the processing gain and is very small. In a traditional setting, there is a single bundle, so the orthogonal frequency division multiplexing channel estimate does not have the same noise effect.

In some extreme cases, the RS is not set on some bundles, as some new radio channels do. One possible current solution to such a technical challenge is disclosed in U.S. Pat. No. 8,286,048, by dynamic scaling of log-likelihood ratio. According to the method of U.S. Pat. No. 8,286,048, the first step is to measure the power spread as the ratio of maximum bin (Fast Fourier Transform bin, which may also be referred to as subcarrier or tone) power to minimum bin power. The dynamic scaling factor has a value of either 1, 2, or 3. When the power spread is above a predetermined threshold, then the method consults a table, such as Table 2 below, to determine a dynamic scaling factor (DSF), otherwise the DSF is equal to 1. The index to a DSF table is generated by either one of, or both, SNR and modulation and coding scheme (MCS) parameters. Modulation and coding scheme (MCS) is used in Table 2 below.

TABLE 2

Scaling Factor Lookup Table

| MCS | 8 | 9 | 10 | 11 | 12 | 13 | 14 | 15 |
|---|---|---|---|---|---|---|---|---|
| SF | 2 | 2 | 2 | 2 | 3 | 3 | 3 | 3 |

As shown in the Scaling Factor Lookup Table of Table 2, the scaling factor (SF) has values of either 2 or 3. Once selected, this SF (either 2 or 3 found in Table 2) is applied to the log-likelihood ratio of each bin of the Fast Fourier Transform. When SF is greater than 1, it may cause overflow and a saturation operation is performed. Using this method causes the power spread to exceed the predetermined threshold. When the power spread does not exceed the predetermined threshold, the SF is set to 1. Further, when the power spread does exceed the predetermined threshold, the index to the DSF table is generated by either one of, or both, SNR and MCS parameters. As shown in Table 2, the SF has a value of either 2 or 3. A saturation operation is performed if this causes an overflow. Additionally, when the power spread is equal to the predetermined threshold, the system or method automatically chooses one action which may be either turning on the DSF or turning off the DSF. While it is an uncommon occurrence for the power spread to be equal to the predetermined threshold, the choice of either turning on the DSF or turning off the DSF does not affect performance. However, the DSF is fixed for all bins, and its scaling by a factor 2 or 3 actually makes the opposite operation for these extreme cases on the blank bundles, which boosts instead of suppresses the noise. Further, the dynamic part of this DSF is to dynamically adjust the scaling factor on a per Fast Fourier Transform basis. However, the method of the present disclosure dynamically adjusts on a per bin basis.

To overcome these and other shortcomings in the art, one embodiment of a method of the present disclosure discussed further below, uses channel power plus noise power to adaptively adjust the scaling factor on per bin basis, and to provide a much wider range of scaling, depending on a channel power and noise power ratio. The scaling factor is calculated by: (signal power)/((signal power)+(Noise Power)). Thus, depending on the signal power of each bin, the scaling factor will dynamically change. For a blank bundle, as the channel power is expected to be close to zero, the scaling factor is expected to be close to zero, and thereby prevents the LLR of these bins from becoming overwhelmingly large so as to fail the low density parity check decoder. When the channel power and scaling factor are close to zero, there is no signal being transmitted on this bundle. The signal received is simply noise. In an ideal environment, the estimated channel should be zero. However, generally some noise exists, which is greatly suppressed by the processing gain. Comparatively speaking, in a non-blank bundle, the estimated channel power is greater than zero, while the blank bundle has an estimated channel power close to zero. In an ideal setting, the log-likelihood ratio of a bin is expected to be around 1.0 to 2.0. In a blank bundle, the log-likelihood ratio is expected to be close to zero, or at least less than 1. Thus, the log-likelihood ratio value greater than 10.0 is considered overwhelmingly large so as to fail the low density parity check decoder, which, in turn, will also fail a cyclic redundancy check (CRC).

Figure 1:
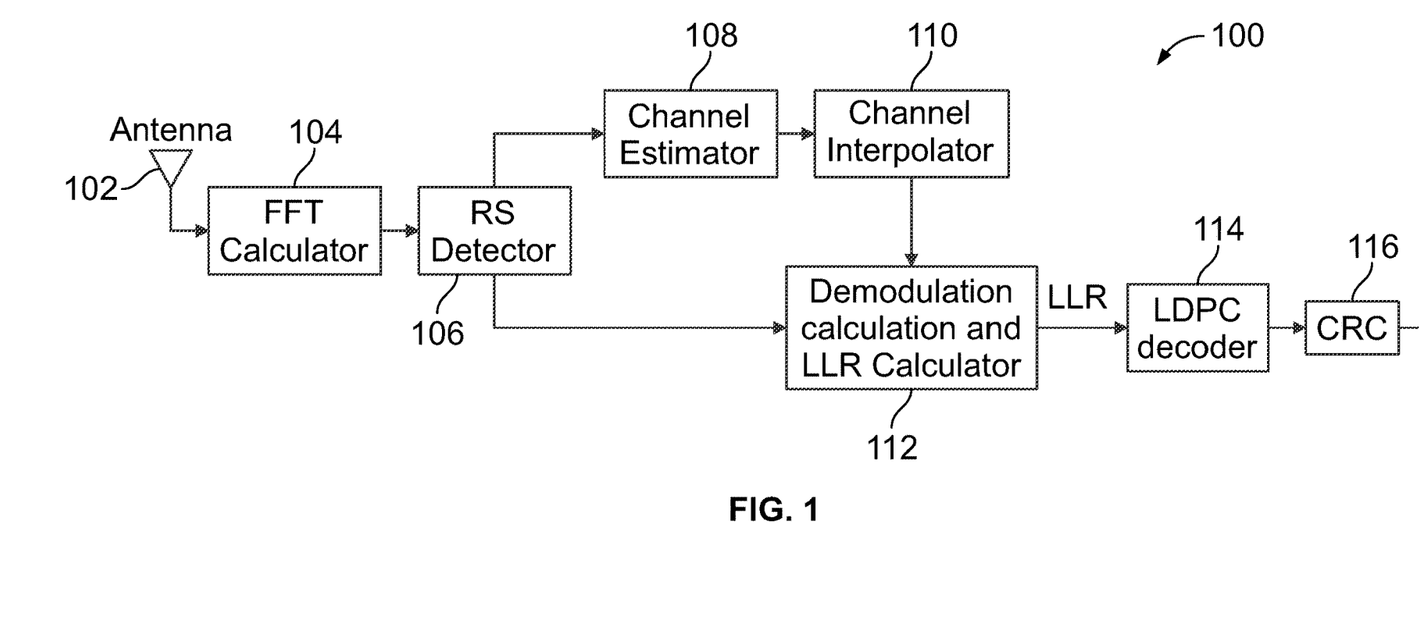
FIG. 1 illustrates a block diagram of a 5G new radio system according to an embodiment.

FIG. 1 illustrates a system 100 according to embodiments of the present disclosure. The system 100 includes an antenna 102 and a controller containing a Fast Fourier Transform calculator 104, a reference sequence detector 106, a channel estimator 108, a channel interpolator 110, a demodulation calculator and LLR calculator 112, a low density parity check decoder 114, and a cyclic redundancy check (CRC) 116.

In FIG. 1, the controller of system 100 automatically receives an incoming signal from an antenna 102. Upon receipt of an incoming signal from the antenna 102, the controller includes a processor to automatically perform the sequence of system 100. The controller further includes the Fast Fourier Transform calculator 104, the reference sequence detector 106, the channel estimator 108, the channel interpolator 110, the demodulation calculator and LLR calculator 112, the low density parity check decoder 114, and the cyclic redundancy check 116.

The Fast Fourier Transform calculator 104 performs the FFT algorithm with the received signal from the antenna 102 and generates a FFT output. In system 100, the FFT output may or may not have a reference sequence. The reference sequence detector 106 determines whether a reference sequence is present in the FFT output or not. A channel estimator 108 receives the FFT output if a reference sequence is detected. The channel estimator 108 automatically generates a channel estimate for the channel interpolator 110 as part of the algorithm. The channel interpolator 110 uses the channel estimate from the channel estimator 108 to predict the data within the dataset. Channel interpolation is beneficial to determine whether any data exists outside of the data set. In system 100, channel interpolation performed by the channel interpolator 110 is beneficial to determine the accuracy of the channel estimate. The demodulation calculator and LLR calculator 112 receives a FFT output directly from the reference sequence detector 106 when the reference sequence detector 106 does not detect a reference sequence in the FFT output from the Fast Fourier Transform calculator 104.

The demodulation calculator and LLR calculator 112 performs a demodulation and LLR calculation using the received FFT output from the reference sequence detector 106 and the output of the channel interpolator 110. The demodulation calculator and LLR calculator 112 generates a LLR output value for the low density parity check decoder 114. The low density parity check decoder 114 receives the LLR value from the demodulation calculator and LLR calculator 112. The low density parity check decoder 114 decodes the information bits with the LLR value received from the demodulation calculator and LLR calculator 112 as input. The cyclic redundancy check (CRC) 116 receives the decoded information bits from the low density parity check decoder 114 and determines whether the decoded information bits are correct. If the results of the decoded information bits from the low density parity check decoder 114 are determined to pass the cyclic redundancy check performed by the cyclic redundancy check 116, the decoded information bits are correct. If the decoded information bits are determined to be correct by the cyclic redundancy check 116, the result may be displayed for a user. The display may be, but is not limited to, an interactive screen, a touchscreen, a graphical user interface, or the like. Further, if the result of the decoded information bits from the low density parity check decoder is determined not to pass the cyclic redundancy check performed by the cyclic redundancy check 116, the decoded information bits are incorrect. If the decoded information bits are determined to be incorrect by the cyclic redundancy check, a status is displayed for a user indicating a failure of the cyclic redundancy check.

In one embodiment, the system 100 can include a radio-frequency (RF) receiver and/or a transceiver for receiving a RF signal from the antenna 102. In another embodiment, the system 100 can include an RF front-end located between the antenna 102 and a receiver. In yet another embodiment, the system 100 can also include a frequency converter coupled to the RF receiver to convert the RF signal received from the antenna 102 to a baseband signal for processing. The frequency converter may be, but is not limited to, a down converter. The frequency converter may be coupled to a baseband processing unit to demodulate and/or decode the baseband signal. To prepare the RF signal for demodulation by the demodulation calculator and LLR calculator 112 and/or decoding by the low density parity check decoder 114, the frequency converter down shifts a radio signal with center frequency to a baseband frequency.

In some embodiments, the baseband processing unit of the controller may be, but is not limited to, a digital signal processor (DSP), a general-purpose processor containing a central processing unit (CPU), a field programmable gate array (FPGA), and/or an application-specific integrated circuit (ASIC) chip, or any combination of these. A combination may be, but is not limited to, a DSP and FPGA, a DSP and a general-purpose processor, or any other combination thereof. The CPU of a general processing unit may contain a memory, which may store the processing instructions configured to automatically execute the algorithm of the controller. A field programmable gate array is mainly used to accelerate the processing of baseband signals. A field programmable gate array is typically used in combination with DSP or ARM in order to accelerate the processing time. However, a field programmable gate array may be used as a standalone processor and is not required to be used in combination with another processor. Additionally, the baseband processing unit may be configured to execute programming stored on a memory. The memory may be, but is not limited to, a hard drive. The programming stored on a memory may include processing instructions configured to automatically execute the algorithm of system 100 located within the controller. The baseband processing unit can automatically access and process the instructions from memory. The system 100 can further include one or more non-transitory memory, power sources, and other peripherals depending on the specific implementation.

There are 14 orthogonal frequency division multiplexing symbols in one slot of 5G new radio. Of the 14 orthogonal frequency division multiplexing symbols in one slot of 5G new radio, some may be embedded with RS for channel estimate in one embodiment, others may be data only orthogonal frequency division multiplexing symbols in another embodiment. In one embodiment, orthogonal frequency division multiplexing symbol numbers 2, 7, and 11 may each have a reference sequence, and the remaining 11 orthogonal frequency division multiplexing symbols may carry only data without a reference sequence. In the method further described below, the channel is first estimated in the frequency bin direction and then be interpolated in time direction for data orthogonal frequency division multiplexing symbols. The interpolated channel estimate is then used for demodulation and LLR calculation.

Figure 2:
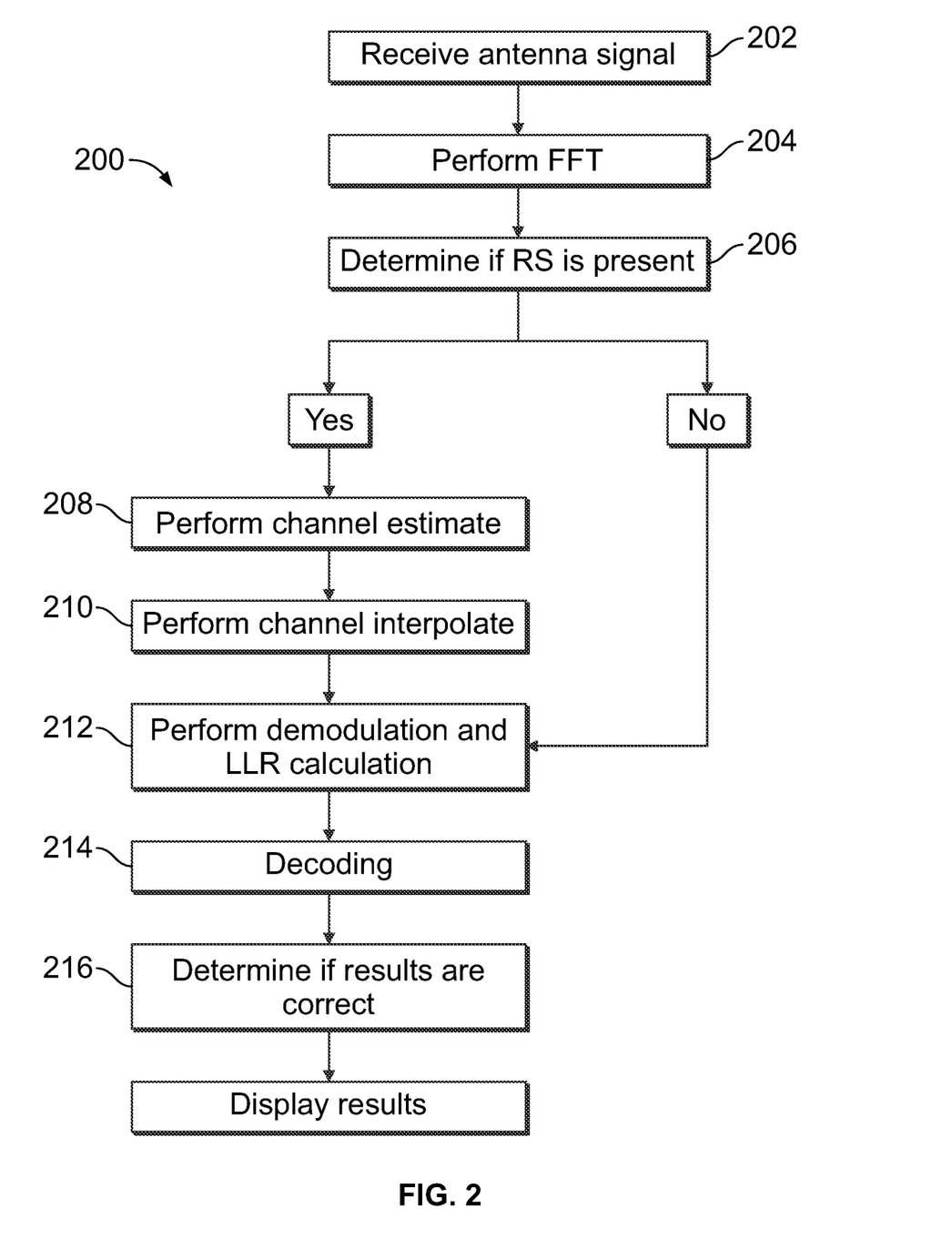
FIG. 2 illustrates a method of a 5G new radio (NR) low-density low density parity check (LDPC) decoding.

FIG. 2 illustrates a method 200 according to embodiments of the present disclosure. A controller of the method 200 automatically receives a signal from an antenna at step 202. Once a signal is received from the antenna at step 202, the controller includes a processor to automatically perform the method steps of method 200. At step 204, the Fast Fourier Transform calculator performs the FFT algorithm with the received signal from the antenna in step 201 and generates a FFT output. In an embodiment, the FFT output may or may not have a reference sequence. At step 206, a reference sequence detector determines whether a reference sequence is present in the FFT output or not. If a reference sequence is present, the FFT output moves to the channel estimator at step 208. If a reference sequence is not present, the FFT output moves to the demodulation calculator and LLR calculator at step 212.

At step 208, a channel estimator receives the FFT output if a reference sequence is present. When a reference sequence is present, the channel estimator automatically generates a channel estimate at step 208. At step 210, the channel interpolator receives the channel estimate from step 208 and uses the channel estimate output to predict the data within the dataset. At step 212, the demodulation calculator and LLR calculator receives a FFT output directly from the reference sequence detector if it was determined that a reference sequence is not present in step 206. At step 212, the demodulation calculator and LLR calculator receives the channel interpolator output from step 210 if it was determined that a reference sequence is present in step 206. Further at step 212, the demodulation calculator and LLR calculator generates a LLR output value for decoding by the low density parity check decoder from step 214. At step 214, low density parity check decoder decodes the information bits with the LLR output value from the demodulation calculator and LLR calculator from step 212 as input. At step 216, the cyclic redundancy check (CRC) 116 receives the decoded information bits from the low density parity check decoder in step 214 and determines whether the decoded information bits are correct. Further at step 216, if the result of the decoded information bits from the low density parity check decoder is determined to pass the cyclic redundancy check performed by the cyclic redundancy check, the decoded information bits are correct. If the decoded information bits are determined to be correct by the cyclic redundancy check, the result may be displayed for a user. The display may be, but is not limited to, an interactive screen, a touchscreen, a graphical user interface, or the like. Further, if the result of the decoded information bits from the low density parity check decoder is determined not to pass the cyclic redundancy check performed by the cyclic redundancy check, the decoded information bits are incorrect. If the decoded information bits are determined to be incorrect by the cyclic redundancy check, a status is displayed for a user indicating a failure of the cyclic redundancy check.

In one embodiment, after the Fast Fourier Transform calculation of step 204 of method 200, the per bin system model can be: $r_{bin}=H_{bin}s+n$; where $r_{bin}$ is the received signal on this bin; $H_{bin}$ is the channel; s is the transmitted signal; and n is the additive white Gaussian noise (AWGN).

In the method of the present disclosure, method 200 contemplates, but is not limited to, at least three embodiments of methods for demodulation and LLR calculation of step 212 of method 200. One of the three demodulation and LLR calculations of step 212 is performed on the received physical downlink shared channel data and/or the received interpolated channel estimate.

A first embodiment of demodulation and LLR calculation of step 212 of method 200 uses equation $r_{bin}*conj(H_{bin})$. If both a received signal and a channel estimate are represented by complex int16 (signed 16 bits) format, then the LLR needs int32 (signed 32 bits). This method, however, may not be efficient for implementation, as it may take too many resources. The first embodiment requires 32 bits to store and process LLR resources and is proportional to the number of bits used. The first embodiment using $r_{bin}*conj(H_{bin})$, does not have noise amplification issue, but rather has the widest log-likelihood ratio spread so the most bits are needed to represent.

A second embodiment of demodulation and LLR calculation of step 212 of method 200 use the equation: $r_{bin}*conj(H_{bin})/norm(H_{bin})$. The equation used in the second embodiment is equivalent to applying only a phase rotation. This second embodiment keeps the same number of bits as a received signal. Therefore, the 16 bit input will remain 16 bits, and a signed 16 bits (int16) for both in-phase (I) and quadrature (Q). The phase rotation does not change the AWGN power per bin, and the log-likelihood ratio is proportional to the channel norm. The second embodiment is be preferred without implementation. With implementation, the second embodiment has two shortcomings. The first shortcoming occurs when the $norm(H_{bin})$ operation first takes the sum the square of I and Q before taking the square root. However, the second embodiment using the square root operation is not efficiently implemented. The second shortcoming of the second embodiment occurs when the signed 16 bits (int16) is still too long for some efficient hardware implementation. In one exemplary embodiment, with a 4-bit, 5-bit, or 6-bit LLR, the intermediate LLR growth requires additional bits. In another exemplary embodiment, the intermediate LLR growth may only require an additional 2 bits. In yet another exemplary embodiment, the intermediate LLR growth may require more than an additional 2 bits. While the additional bits may make be an even number, it is not efficient on DSP or ARM. Thus, the second embodiment does not have noise amplification issue, but the second embodiment has the second widest LLR spread so needs more bits to represent than the third embodiment described further below.

Figure 4:
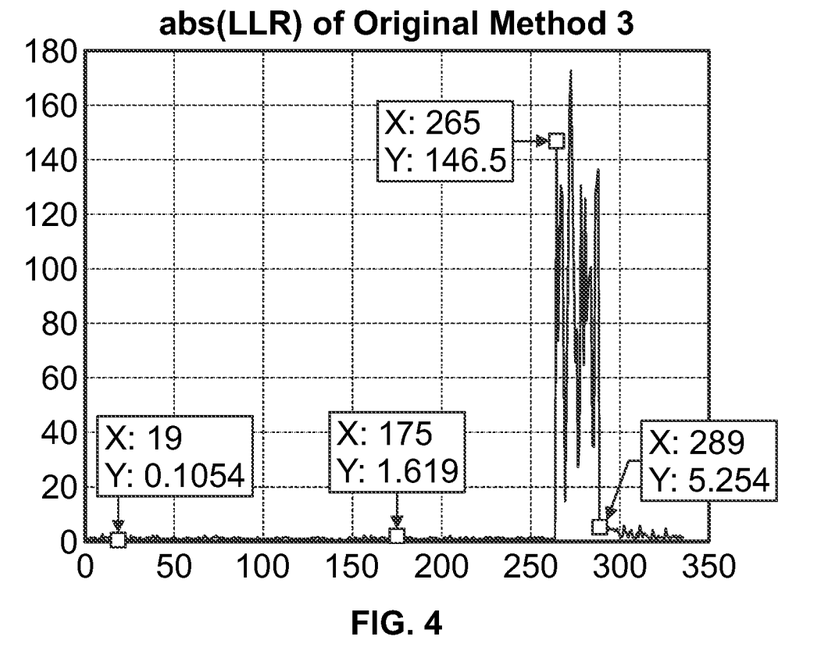
FIG. 4 illustrates a plot of the absolute value of the log-likelihood ratio using an original embodiment.

The original third embodiment of demodulation and LLR calculation of step 212 of method 200 as represented in the plot shown in FIG. 4, uses the equation: $r_{bin}*\text{conj}(H_{bin})/\text{norm}(H_{bin})^2$. In this original third embodiment of demodulation and LLR calculation of step 212 of method 200, the square of the norm equals to power: $\text{norm}(H_{bin})^2 = H_{bin}*\text{conj}(H_{bin})$. Without needing to calculate the square root, the original third embodiment is advantageous as it is much easier to implement. This original third embodiment of demodulation and LLR calculation of step 212 of method 200 normalizes all values to ±1.0. A low density parity check decoder, according to one embodiment of the present disclosure, uses 4095 to represent 1.0 and up-limit the LLR to ±8191 (signed 14 bit) after each variable-to-check or check-to-variable LLR updates. The signed 16 bits (int16) type of DSP should be suitable implementation in this original third embodiment, as it provides an extra 2 bits for intermediate LLR growth over ±8191 range.

In another embodiment of demodulation and LLR calculation of step 212 of method 200, for more efficient implementation, less bits may be used, such as with up-limit to ±63 (signed 6 bit), and with signed 8 bit (int8) for intermediate LLR growth. However, using a lesser number of bits may negatively impact the performance. The single instruction multiple data (SIMD) instructions of DSP or ARM can take advantage of parallel processing with 16 bits (int16) or 8 bits (int8) types.

The third embodiment of demodulation and LLR calculation of step 212 of method 200 may be similar to a zero-forcing (ZF) equalizer. The zero-forcing (ZF) equalizer may be problematic with blank bundles for the above-mentioned new radio 5G channel, because the zero-force equalizer amplifies the noise for blank bundles. The physical downlink shared channel of the mentioned new radio 5G channel may occupy a total of 336 bins. The bins may be divided into 14 bundles with bundle size 24 bins each.

Figure 3:
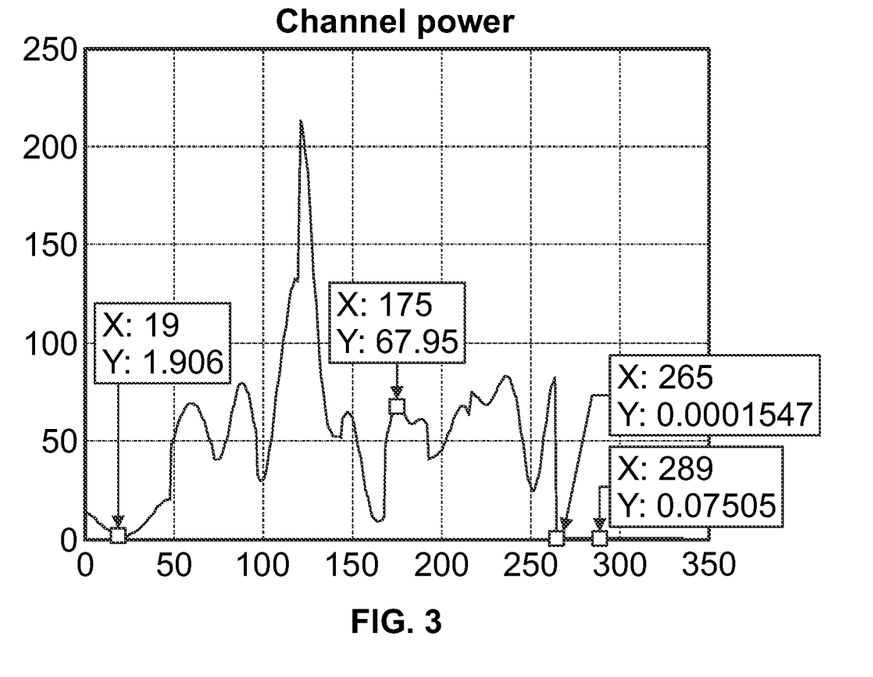
FIG. 3 illustrates channel power over all bins.

FIG. 3 illustrates a representation of the plot of channel power over all bins, where the x-axis represents the Fast Fourier Transform index and the y-axis represents the channel power. The first bundles between 0 through 50, plotted along the x-axis, produce an estimated channel power of less than 50 as plotted along the y-axis. In the plot shown in FIG. 3, the bundles between 50-265 produce an estimated channel power of roughly between 50-100 as shown on the y-axis with one spike in the channel power peaking at over 200. The channel power peak at over 200 occurs between bins 100 through 150. However, the last 3 bundles starting from bin 265 do not have a reference sequence on them, so the estimated channel may have power almost close to zero as shown in FIG. 3. As plotted in FIG. 3, bin 19, as shown along the x-axis, represents an estimated channel power of less than 50 with a value of 1.906 as shown along the y-axis. Additionally, bin 175, as shown along the x-axis, represents an estimated channel power between 50 through 100 with a value of 67.95 as shown along the y-axis. Further, bin 289, as shown along the x-axis, represents an estimated channel power of less than 50 with a value of 0.07505 as shown along the y-axis. Bin 265 on the x-axis is the start of the significant noise amplification region, while bin 289 is the end of the significant noise amplification region.

FIG. 4 is a plot illustrating the absolute value of the LRR (abs (LLR)) of the original third embodiment for the demodulation and LLR calculation step 212 of method 200 discussed above where the x-axis represents the Fast Fourier Transform index and the y-axis represents the absolute value of LLR. This embodiment works well for bins 1 to 264, which have no blank bundles. From bin 265, the noise becomes enhanced and/or amplified and so the LLR value is much bigger than normal. In one exemplary embodiment, as shown in the plot of FIG. 4, the absolute value of LLR is close to zero along the y-axis when the value along the x-axis is between zero and 264. As further shown in the plot of FIG. 4, the value along the y-axis spikes to a value of greater than 160 when the value along the x-axis is between 265-289 before the value of the y-axis drops back down to a value of close to zero when the value of the x-axis is greater than 289. As further shown in the plot of FIG. 4, bin 19, as shown along the x-axis, represents an estimated channel power between zero through 50 and the absolute value of LLR of less than 20 along the y-axis with a value of 0.1054. Additionally, bin 175, as shown along the x-axis, represents an estimated channel power between 150 through 200 and the absolute value of LLR of less than 20 on the y-axis, with a value of 1.619. Additionally, bin 265, as shown along the x-axis, represents an estimated channel power between 250 through 300 and the absolute value of LLR of between 140 to 160 along the y-axis with a value of 146.5. Further, bin 289, as shown along the x-axis, represents an estimated channel power between 250 through 300 and the absolute value of LLR of less than 20 along the y-axis with a value of 5.254. The original third embodiment still generates a large peak, reaching over 160 as shown in the plot of FIG. 4.

The ratio of bins 175 to 19 is 1.619/0.1054=15.3605, which is not large. However, from bin 265, the noise gets enhanced, or amplified, so the LLR value is larger than normal.

To resolve such an issue, according to another embodiment of the present invention, the equation of the original third embodiment for the demodulation and LLR calculation step 212 of method 200 is improved to: $r_{bin}*\text{conj}(H_{bin})/(\text{norm}(H_{bin})^2+\text{Noise\_Power})$, which is similar to a minimum mean squared error (MMSE) equalizer. This improved third embodiment for the demodulation and LLR calculation step 212 of method 200 reduces the noise amplification as shown in the plots shown in FIGS. 5 and 6. To note, zero-forcing and minimum-mean square error are general terms that may be applied to a variety of applications. For example, an orthogonal frequency division multiplexing channel estimator may be based on zero-forcing or minimum-mean square error. However, channel estimate by conventional minimum-mean square error may not be functional for a blank bundle case, because such a system may still produce a noise enhancement or amplification problem without the improvements described in the third method, which uses: $r_{bin}*\text{conj}(H_{bin})/(\text{norm}(H_{bin})^2+\text{Noise\_Power})$. In a situation with blank bundles, there is no RS sent. Therefore, the minimum-mean square error channel estimate can only return noise like a channel estimate with power close to zero. Thus, the blank bundle case still has noise amplification.

Figure 5:
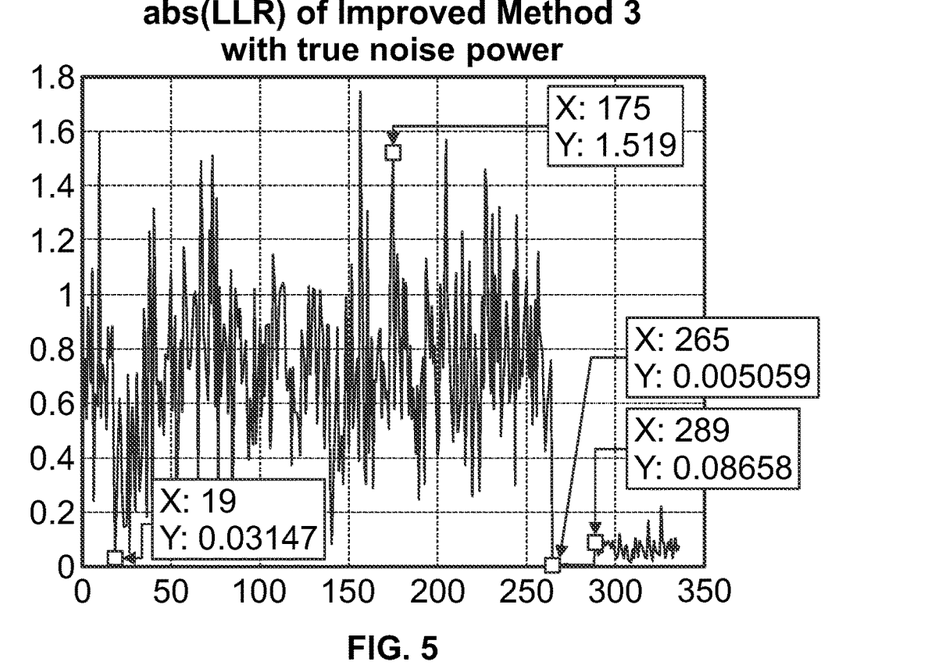
FIG. 5 illustrates a plot of the absolute value of the log-likelihood ratio using an improved embodiment $(r_{bin}^* \text{conj}(H_{bin})/(\text{norm}(H_{bin})^2 + \text{Noise\_Power}))$ according to an embodiment.

FIG. 5 is a plot illustrating the absolute value of the LLR (abs (LLR)) of the improved third embodiment with the true noise power where the x-axis represents the Fast Fourier Transform index and the y-axis represents the absolute value of LLR. In the plot of FIG. 5, the noise power used in the equation is the true noise power as a by-product of the channel estimator and SNR measurement. It is noted that the true noise power in absolute value may be tricky to estimate, due to different FFT/IFFT gains on different implementation/platforms. Thus, according to an embodiment herein, the noise power estimate can be simplified by measuring the mean channel power across all bins and taking 1/10 of this mean channel power as noise power in the equation. In an exemplary embodiment, as shown in the plot of FIG. 5, the absolute value of LLR varies between 0.03147 through 1.8 along the y-axis when the value along the x-axis is the number of bins between zero through 264 and the absolute value of LLR is reduced further to less than 0.08658 on the y-axis when the number of bins along the x-axis are between 265 through 289. Further shown in FIG. 5, the value along the y-axis spikes to a value of greater than 0.2 and when the value of the number of bins along the x-axis is between 289 through 336. The improved third embodiment with true noise power, as plotted in FIG. 5, shows a reduced noise amplification in the plot as compared to using the original third method shown in the plot of FIG. 4. In an exemplary embodiment, as plotted in FIG. 5, bin 19, as shown along the x-axis, represents an estimated channel power between zero through 50 and the absolute value of LLR of less than 0.2 along the y-axis with a value of 0.03147. Additionally, bin 175, as shown along the x-axis, represents an estimated channel power between 150 through 200 and the absolute value of LLR as being between 1.4 through 1.6 along the y-axis with a value of 1.519. Additionally, bin 265, as shown along the x-axis, represents an estimated channel power between 250 through 300 and the absolute value of LLR of less than 0.2 along the y-axis with a value of 0.005059. Lastly, bin 289, as shown along the x-axis of the plot in FIG. 5, represents an estimated channel power between 250 through 300 and the absolute value of LLR of less than 0.2 along the y-axis with a value of 0.08658.

The ratio of bins 175 to 19 is 1.519/0.03147=48.2682, which is larger than the original third embodiment of FIG. 4. The larger ratio is due to low channel power bins that get more attenuation according to the equation.

Figure 6:
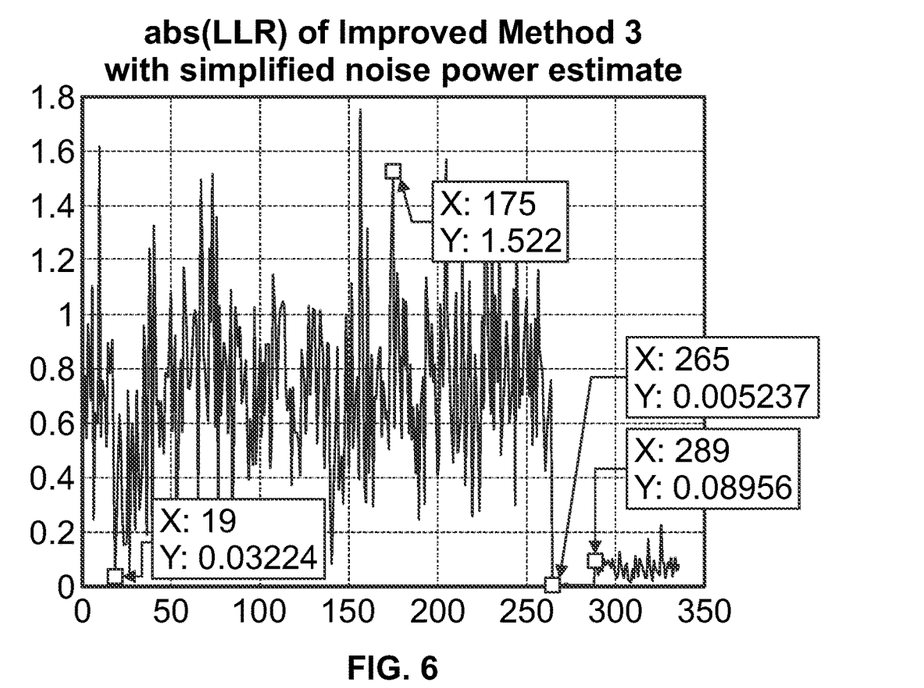
FIG. 6 illustrates a plot of the absolute value of the log-likelihood ratio using an improved embodiment $(r_{bin}^* \text{conj}(H_{bin})/(\text{norm}(H_{bin})^2 + \text{Noise\_Power}))$ with simplified noise power estimate.

The absolute value of LLR (abs (LLR)) of the improved third embodiment for the demodulation and LLR calculation step 212 of method 200 with simplified noise power estimate is shown in the plot of FIG. 6 where the x-axis represents the Fast Fourier Transform index and the y-axis represents the absolute value of LLR. Such simplified method suppresses the blank bundles LLR further. In an exemplary embodiment shown in the plot of FIG. 6, the absolute value of LLR is reduced to a value between 0.03224 through 1.8 on the y-axis when the value of the x-axis is between zero though 264. Further shown in the plot of FIG. 6, the absolute value of LLR drops to a value of less than 0.2 along the y-axis when the value of the number of bins along the x-axis is between 265 through 336. The improved third embodiment for the demodulation and LLR calculation step 212 of method 200 with simplified noise power estimate, as shown in the plot of FIG. 6, shows a reduced noise amplification as compared to using the original third method shown in the plot of FIG. 4. In an exemplary embodiment, as plotted in FIG. 6, bin 19, as shown along the x-axis, represents an estimated channel power between zero through 50 and the absolute value of LLR of less than 0.2 along the y-axis with a value of 0.03224. Additionally, bin 175, as shown along the x-axis, represents an estimated channel power between 150 through 200 and the absolute value of LLR as being between 1.4 through 1.6 along the y-axis with a value of 1.522. Additionally, bin 265, as shown along the x-axis, represents an estimated channel power between 250 through 300 and the absolute value of LLR of less than 0.2 along the y-axis with a value of 0.005237. Lastly, bin 289, as shown along the x-axis of FIG. 6, represents an estimated channel power between 250 through 300 and the absolute value of LLR of less than 0.2 with a value of 0.08956 as shown along the y-axis.

The ratio of bins 175 to 19 is 1.522/0.03224=47.2084, which is close to improved third embodiment of FIG. 5. Having a ration similar to the improved third embodiment as shown in FIG. 5 is representative that the improved third embodiment with simplified noise power estimate works well. For the smallest LLR value of 0.03224, if ±1.0 is represented by ±4095, then 0.03224*4095=132.8418, which is more precise. Even if ±1.0 is represented by ±63, then 0.03224*63=2.0437 which is still above zero. For a field programmable gate array (FPGA), and/or an application-specific integrated circuit (ASIC) implementation of the low density parity check decoder, it can have more flexibility in the trade-off between number of bits and performance.

Figure 7:
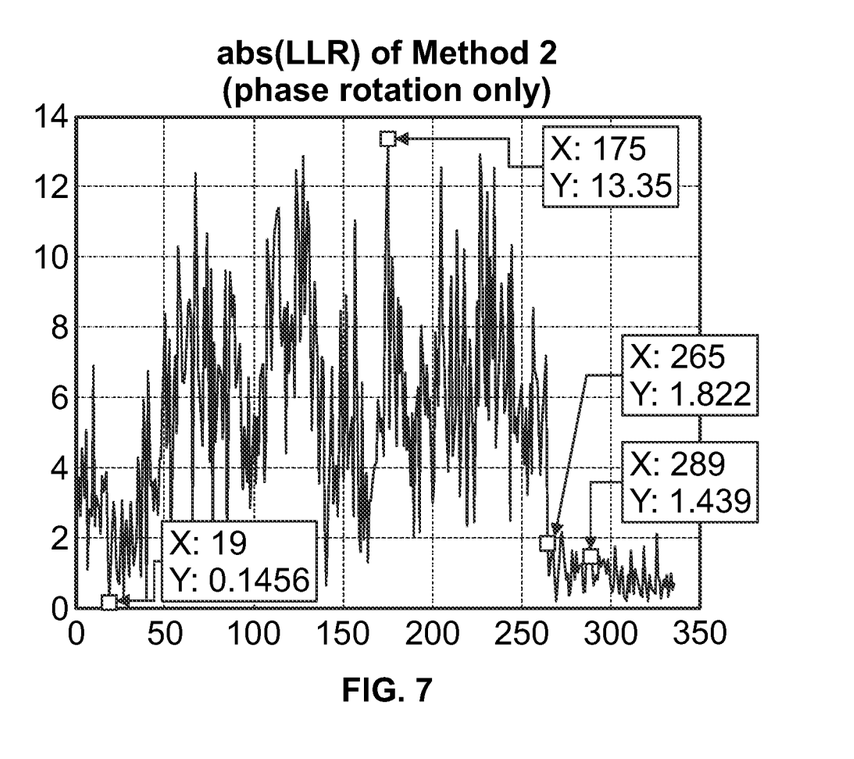
FIG. 7 illustrates a plot of the absolute value of the log-likelihood ratio using $(r_{bin}^* \text{conj}(H_{bin})/\text{norm}(H_{bin}))$ with phase rotation only.

For comparison, the absolute value LLR (abs (LLR)) of the second embodiment is plotted in FIG. 7 where the x-axis represents the Fast Fourier Transform index and the y-axis represents the absolute value of LLR. In this exemplary embodiment, the blank bundles shown in the plot of FIG. 7 are smaller than a typical bundle. In this exemplary embodiment shown in the plot of FIG. 7, the absolute value of LLR is reduced to a value of 0.1456 along the y-axis when the value of the number of bins along the x-axis is between zero through 264. Further shown in the plot of FIG. 7, the value along the y-axis drops to a value of less than 0.2 when the value of the number of bins along the x-axis is between 265 through 336. In this exemplary embodiment, as plotted in FIG. 7, bin 19, as shown on the x-axis, represents an estimated channel power between zero through 50 and the absolute value of LLR of less than 2.0 along the y-axis with a value of 0.1456. Additionally, bin 175, as shown along the x-axis, represents an estimated channel power between 150 through 200 and the absolute value of LLR between 12 through 14 along the y-axis with a value of 13.35. Additionally, bin 265, as shown on the x-axis, represents an estimated channel power between 250 through 300 and the absolute value of LLR of less than 2.0 along the y-axis with a value of 1.822. Lastly, bin 289, as shown on the x-axis of the plot of FIG. 7, represents an estimated channel power between 250 through 300 and the absolute value of LLR of less than 2.0 along the y-axis with a value of 1.439.

The ratio of bins 175 to 19 is 13.35/0.1456=91.6896, which is higher than the original third embodiment or improved third embodiment with either true or simplified noise power estimates. Further, the first embodiment for the demodulation and LLR calculation step 212 of method 200 produces a ratio bin 175 to 19 as the simple square of that method at $91.6896^2=8406.98$. This embodiment shown in the plot of FIG. 7 is a disadvantage for an implementation with a limited number of bits.

The first embodiment, second embodiment, original third embodiment, and updated third embodiment are specific embodiments of method 200 for 5G NR low-density parity-check decoding according to the present invention have been described for the purpose of illustrating the manner in which the invention can be made and used. It should be understood that the implementation of other variations and modifications of this invention and its different aspects are apparent to one skilled in the art, and that this invention is not limited by the specific embodiments described. Features described in one embodiment can be implemented in other embodiments. The subject disclosure is understood to encompass the present invention and any and all modifications, variations, or equivalents that fall within the spirit and scope of the basic underlying principles disclosed and claimed herein.

What is claimed is:

1. A method for 5G new radio (NR) low-density low density parity check (LDPC) decoding by a processor comprising:
performing a Fast Fourier Transform using a Fast Fourier Transform algorithm;
determining if a reference sequence is present;
performing a channel estimate and a channel interpolate for the channel estimate if the reference sequence is present;
demodulating at least one orthogonal frequency division multiplexing (OFDM) symbol according to $r_{bin}*\text{conj}(H_{bin})/(\text{norm}(H_{bin})^2+\text{Noise\_Power})$;
decoding the demodulated at least one orthogonal frequency division multiplexing symbol; and
determining if the decoded at least one orthogonal frequency division multiplexing symbol is correct.

2. The method of claim 1, wherein the noise power is obtained by measuring a mean channel power across all bins and taking a ratio of the mean channel power as the noise power.

3. The method of claim 2, wherein the ratio is $1/10$.

4. The method of claim 1, wherein the noise power is obtained by using a ratio of the mean channel power across OFDM bins.

5. The method of claim 1, wherein the noise power is obtained by using a ratio of the mean channel power across subcarriers.

6. The method of claim 1, wherein the noise power is obtained by using a ratio of the mean channel power across tones.

7. A method for 5G new radio (NR) low-density low density parity check (LDPC) decoding by a processor comprising:
performing a Fast Fourier Transform using a Fast Fourier Transform algorithm;
determining if a reference sequence is present;
demodulating at least one orthogonal frequency division multiplexing (OFDM) symbol according to $r_{bin}*\text{conj}(H_{bin})/(\text{norm}(H_{bin})^2+\text{Noise\_Power})$ if the reference sequence is not present;
decoding the demodulated at least one orthogonal frequency division multiplexing symbol; and
determining if the decoded at least one orthogonal frequency division multiplexing symbol is correct.

8. The method of claim 7, wherein the noise power is obtained by measuring a mean channel power across all bins and taking a ratio of the mean channel power as the noise power.

9. The method of claim 8, wherein the ratio is $1/10$.

10. The method of claim 7, wherein the noise power is obtained by using a ratio of the mean channel power across OFDM bins.

11. The method of claim 7, wherein the noise power is obtained by using a ratio of the mean channel power across subcarriers.

12. The method of claim 7, wherein the noise power is obtained by using a ratio of the mean channel power across tones.

13. A system for 5G new radio (NR) low-density low density parity check (LDPC) decoding comprising:
an antenna that provides an antenna signal;
a Fast Fourier Transform calculator that receives the antenna signal and performs a Fast Fourier Transform algorithm to produce a FFT output;
a reference sequence detector that checks whether a reference sequence is present in the FFT output;
a channel estimator that generates a channel estimate for the FFT output when the reference sequence is detected to be present in the FFT output and a channel interpolator that processes the channel estimate and produces a channel interpolator output;
a demodulation calculator and a log-likelihood ratio calculator that performs a calculation on the channel interpolator output according to $r_{bin}*\text{conj}(H_{bin})/(\text{norm}(H_{bin})^2+\text{Noise\_Power})$ and produces a log-likelihood ratio output;
a low density parity check decoder that decodes the log-likelihood ratio output; and
a cyclic redundancy check that determines whether the decoded log-likelihood ratio is correct.

* * * * *